(12) United States Patent
Dolezel et al.

(10) Patent No.: US 11,476,080 B2
(45) Date of Patent: Oct. 18, 2022

(54) DEVICE WITH AT LEAST ONE ADJUSTABLE SAMPLE HOLDER AND METHOD OF CHANGING HOLDER TILT ANGLE AND METHOD OF PREPARING A LAMELLA

(71) Applicant: Tescan Brno, s.r.o., Brno (CZ)

(72) Inventors: Pavel Dolezel, Brno (CZ); Tomas Hrncir, Ricmanice (CZ)

(73) Assignee: Tescan Brno, S.R.O., Brno (CZ)

( * ) Notice: Subject to any disclaimer, the term of this patent is extended or adjusted under 35 U.S.C. 154(b) by 0 days.

(21) Appl. No.: 17/283,201

(22) PCT Filed: Oct. 10, 2019

(86) PCT No.: PCT/CZ2019/050046
§ 371 (c)(1),
(2) Date: Apr. 6, 2021

(87) PCT Pub. No.: WO2020/074026
PCT Pub. Date: Apr. 16, 2020

(65) Prior Publication Data
US 2021/0384005 A1    Dec. 9, 2021

(30) Foreign Application Priority Data
Oct. 10, 2018   (CZ) .............................. PV 2018-539

(51) Int. Cl.
*H01J 37/20*   (2006.01)
*H01J 37/28*   (2006.01)

(52) U.S. Cl.
CPC .............. *H01J 37/20* (2013.01); *H01J 37/28* (2013.01); *H01J 2237/2067* (2013.01); *H01J 2237/20207* (2013.01); *H01J 2237/2802* (2013.01)

(58) Field of Classification Search
CPC .. H01J 37/00; H01J 37/02; H01J 37/20; H01J 37/26; H01J 37/28; H01J 37/3056;
(Continued)

(56) References Cited

U.S. PATENT DOCUMENTS 5,089,708 A    2/1992  Asselbergs
5,852,298 A  * 12/1998  Hatakeyama ........... H01J 37/20
                                                    250/442.11
(Continued)

FOREIGN PATENT DOCUMENTS

JP          3805547 B2    8/2006

OTHER PUBLICATIONS

European Patent Office, International Search Report, dated Jan. 30, 2020, in PCT/CZ2019/050046, filed Oct. 10, 2019.
(Continued)

*Primary Examiner* — Jason L McCormack
(74) *Attorney, Agent, or Firm* — Thedford I. Hitaffer; Hitaffer & Hitaffer, PLLC

(57) ABSTRACT

A device comprises an electron column or an ion column, provided with an adjustable holder. The adjustable holder maintains the whole range of movements of the manipulation stage and is adapted to change its position in relation to the stage at least in one direction, wherein the range of movements of the manipulation stage is sufficient to change this position and it is unnecessary to install any other control drive or actuator.

17 Claims, 14 Drawing Sheets

(58) Field of Classification Search
CPC ....... H01J 2237/2067; H01J 2237/2802; H01J 2237/206; H01J 2237/28; H01J 2237/31745; H01J 2237/31749
USPC ...... 250/306, 307, 311, 492.1, 492.2, 492.21
See application file for complete search history.

(56) References Cited

U.S. PATENT DOCUMENTS

| | | |
|---|---|---|
| 6,963,068 B2 | 11/2005 | Asselbergs et al. |
| 7,474,419 B2 | 1/2009 | Tappel et al. |
| 8,247,785 B2 | 8/2012 | Zeile et al. |
| 8,754,384 B1 | 6/2014 | Persoon et al. |
| 9,653,260 B2 | 5/2017 | Keady et al. |
| 2011/0017922 A1 | 1/2011 | Amador |
| 2011/0226947 A1* | 9/2011 | Takahashi ............... H01J 37/20 250/307 |
| 2019/0318908 A1* | 10/2019 | Biberger ............. H01J 37/3056 |

OTHER PUBLICATIONS

European Patent Office, Written Opinion, dated Jan. 30, 2020, in PCT/CZ2019/050046, filed Oct. 10, 2019.

\* cited by examiner

DEVICE WITH AT LEAST ONE ADJUSTABLE SAMPLE HOLDER AND METHOD OF CHANGING HOLDER TILT ANGLE AND METHOD OF PREPARING A LAMELLA

CROSS-REFERENCE TO RELATED APPLICATIONS

This application, filed under 35 USC 371, is a United States National Stage Application of International Application No. PCT/CZ2019/050046, filed Oct. 10, 2019, which claims priority to CZ Application No. PV 2018-539, filed on Oct. 10, 2018, the disclosures of which are incorporated herein by reference.

FIELD OF THE INVENTION

The invention relates to a sample holder for a device using an electron or ion beam and to the use of this holder for preparation of lamellas, particularly for a transmission electron microscopy.

BACKGROUND OF THE INVENTION

Modern techniques for preparation of samples, which can be observed with the use of electron microscopy (EM), particularly transmission electron microscopy (TEM) and scanning transmission electron microscopy (STEM) require very precise sample machining. Frequently used are devices and methods using a device allowing extraction of a part of the sample from the substrate and adapt the extracted sample into a form suitable for observation, known as in-situ, i.e. with the use of the same device and without opening the working chamber. The sample suitable for observation is usually in shape of a lamella, which is sufficiently thin (<100 nm) to be transmitted by a beam.

The device suitable for this type of lamella preparation must be adapted for sample observation and sample machining. The sample can be observed, for example, by particle microscopy, e.g. scanning electron microscope (SEM). The sample can be machined particularly by a beam of particles, e.g. a focused ion beam (FIB) or a broad ion beam (BIB).

The sample preparation workflow usually includes a step in which the substrate is placed on the manipulation stage, a step in which the sample is extracted from the substrate, a step in which the sample is formed into a lamella, a step in which the lamella is placed in a lamella holder, a step in which the lamella is thinned into the required final thickness, and a step in which the lamella is observed using transmission technique. Based on a required result, such workflow requires demanding manipulation with the sample during the individual steps and between the individual steps.

Manipulation with the sample may be performed, for example, using a range of manipulation stage movements, a micro-manipulator present in the chamber, or using a range of lamella holder movements. Combinations of individual methods are frequently used.

The existing TEM lamella holders provide a limited range of movements or have a complicated structure requiring even several mutually dependent or independent manipulation devices.

A device having a limited range of movement is described, for example, in a patent U.S. Pat. No. 8,247,785 B2, which discloses a sample holder having an area for the substrate placement, and a lamella holder placed in such way that their mutual position is unchangeable during the handling with the sample holder.

Another solution is an adjustable holder of TEM lamellas disclosed in a patent application U.S. 20110017922A1. This application discloses a holder, where a lamella holder position can extend over the range of manipulation stage movements. The lamella holder position can be adjusted either manually with the use of a micro-manipulator tip, or automatically with the use of an independent motor. It is stated in the document that the sample can be tilted by ±90° from the zero position. Furthermore, the holder is equipped with fixation bolts, which apply pressure to the shaft, thus helping to maintain the required tilt. On the other hand, the pressure of these bolts cannot be changed without external intervention while the working chamber is closed. The bolts pressure thus needs to be set in advance and it is necessary to find a compromise between the stable fixed position of the lamella holder and the shaft resistance at the change of the holder position, wherein resistance that is too high may lead to manipulator damage and, in contrast, resistance that is too low may cause undesirable vibrations, or unwanted holder movement.

Another solution is disclosed in a patent U.S. Pat. No. 6,963,068 B2. This device has an area for placement of the substrate and a lamella holder. The lamella holder is characterized in that, in comparison with the manipulation stage, it has more degrees of freedom, without comprising an additional manipulation motor. The additional degree of freedom is reached by interconnecting the control mechanism of the manipulation stage and the adjustable mechanism of the lamella holder. Therefore, the change of position of the lamella holder and the substrate are mutually dependent. A drawback of the system is that it is necessary to change the position of the substrate in relation to the ion beam in case it is necessary to change the lamella holder position within the additional degree of freedom. In addition, the lamella holder does not allow full range of manipulation stage movement (setting of axis Z-shift and rotation along Z are missing).

The patent U.S. Pat. No. 8,754,384B1 discloses a sample preparation stage having an area for placing the substrate and a TEM lamella holder. This stage allows mutually independent positioning of the individual holders. Each of the holders has at least one own drive. Therefore, the device requires a complex mechanism with more motors for positioning. The higher number of drives generally increases the failure rate of the system, complexity of servicing, device maintenance, production demands and, consequently, device price.

The patent U.S. Pat. No. 7,474,419B2 and patent JP3805547 disclose and display other examples of devices having an area for placing the substrate and a lamella holder, wherein the lamella holder can be positioned at least in one direction with the use of an independent drive. Similarly to the previous case, the higher number of drives generally means higher failure of the system, complexity of servicing, device maintenance, more demanding production and, consequently, higher device price.

The patent U.S. Pat. No. 9,653,260B2 discloses a lamella holder allowing change of the lamella holder position in relation to the area for placement of the sample, although it is not explained in the document how is this change achieved.

SUMMARY OF THE INVENTION

The present invention represents a device comprising an electron column and an ion column, provided with an adjustable holder. This holder retains the full range of the manipulation stage movement and is further adapted to change its position in relation to the stage at least in one direction, wherein the change of position only requires the movement range of the manipulation stage and no other control drive or actuator needs to be installed.

The invention is a device with at least one adjustable sample holder comprising an adjustable sample holder arranged inside the working chamber on the manipulation stage, wherein the adjustable holder comprises a moveable element having an area for placement of a sample, a rotating shaft, at least one pillar adapted to support the shaft, and the device further comprising a mechanism for fixing the moveable element comprising a crown mounted to the shaft, and a counterpart adapted to immobilize the shaft in relation to the counterpart, the mechanism for fixing the moveable element further being adapted for setting the moveable element into a stationary position, in which the manipulation stage movement range is maintained, and into a moveable position, in which the adjustable holder has at least one more degree of freedom, characterized in that in the moveable position of the moveable element the manipulation stage is adapted for movement, allowing to change the plane position of the moveable element in relation to the plane of the placement area.

The device can be an electron microscope, which can be scanning or transmission microscope, or another device requiring a change in sample position in relation to the manipulation stage placement area during machining or observing without the need to open the working chamber, and this change may be performed automatically on the basis of predefined lamella preparation parameters.

For sample observation or machining, the device may further include one or more columns, particularly electron microscope columns, ion columns or a combination thereof, and may further include optical columns, particularly a laser microscope column, a column for Raman spectrometry or an optical column.

The working chamber according to the invention can be a vacuum chamber running at very low pressure, which cannot be opened during machining without damaging the sample, device, or breaking the operating cycle.

The manipulation stage may be provided with a mechanism for movement along three axes perpendicular to each other. The movement range of the manipulation stage may be even lower, or potentially, the individual axes may not be completely perpendicular to each other. It always depends on a specific use of the device. In a preferred embodiment, the stage has at least one rotational axis aligned with the longitudinal axis of the shaft.

The manipulation stage may include an area for placing one or more adjustable sample holders and, furthermore, an area for placing one or more non-adjustable sample holders, and one or more substrate holders, wherein adjustable and non-adjustable holders may be placed on the manipulation stage simultaneously. The non-adjustable holder is a holder, manipulation range of which corresponds with the manipulation stage range.

The holder includes at least one pillar adapted to support the shaft and a mechanism for fixing the moveable element of the adjustable holder. Preferably, it is also possible to use two pillars located on both sides of the moveable element providing higher stability and lower vibrations. Each of the pillars supports the shaft, which may consist of multiple parts, wherein their longitudinal axes are identical. In contrast, when using a single pillar, there is an access to the sample from more sides as well as better variability of the machining methods than in a case of two pillars.

The moveable element may be in a shape of, for example, a blade mounted to the shaft, or the shaft itself may be the moveable element, wherein the moveable element plane is a plane that intersects the area for sample placement and shaft axis or its vicinity and is parallel to this plane.

The fixation mechanism may include a pivot on at least one of the pillars, a rosette with openings in the moveable element, wherein the openings fit the pivot size and are deployed along the circumference of the rosette, and a pressure device, which may be a spring, for example. The number and arrangement of openings then define the range of possible positions of the moveable element. A person skilled in the art may find another mechanism ensuring the same function. For example, the rosette may be replaced with openings provided directly in the pillar or in the moveable element. The device may also include a larger number of pivots.

The fixation mechanism of the moveable element can be controlled using a crown mounted on the shaft and a corresponding counterpart located inside the working chamber. Upon the contact of the crown and the counterpart, it is necessary to apply pressure to the pressure mechanism, that is sufficient to overcome the pressure mechanism, and the moveable element fixation mechanism is released. In this position the shaft is immobilized against the counterpart. Subsequently, the released moveable element can be positioned. After setting the right position, the moveable element is reinstated in the non-moveable position by disconnecting the crown and counterpart, when the pressure device inserts the pivot into the corresponding opening.

Positioning of the moveable element is performed in such way that after setting the fixation mechanism into the released position, it is impossible to change the position of the moveable element towards the counterpart. Changes in a holder tilt angle, which is an angle between the moveable element plane and the plane of the manipulation stage area, may then be achieved by rotating of the manipulation stage around the shaft axis or approximately similar movement is reached with the use of different rotations and the movement of the manipulation stage, namely using rotations with their movement vector inside the plane perpendicular to the shaft axis.

After a change in the moveable element position, the crown and the counterpart are disconnected, and the moveable element fixation mechanism is set into the non-moveable position. The moveable element is now in non-moveable position in relation to the plane of the manipulation stage area. The change in the moveable element position can be repeated, resulting in that the moveable element can be positioned in range of 360° around the shaft axis.

The counterpart inside the vacuum chamber can be placed on any part of the chamber or its equipment, particularly on electron detectors, on manipulators, sample exchangers, a decontaminator, a device for special analyses, e.g. AFM, cameras, chamber lighting, particle column, gas injection system, and the like, and the counterpart may either be moveable or stationary.

The method of changing the tilt angle of the holder, which is located on the manipulation stage, is characterized in that it includes the steps of: placing the holder with a first holder tilt angle and fixation mechanism in non-moveable position into a position when the crown is near the counterpart; releasing the fixation mechanism of the moveable element by pressing the crown or the counterpart with sufficient force to overcome the resistance of the pressure mechanism.

rotating the manipulation stage around the longitudinal axis of the shaft so that the moveable element plane and the manipulation stage plane form a second holder tilt angle, different from the first holder tilt angle;

reinstating the moveable element fixation mechanism into a non-moveable position by moving the crown and the counterpart away from each other.

This procedure can be repeated until the required angle between the moveable element plane and the plane of the manipulation stage area is reached.

In the position when the shaft is non-moveable in relation to the counterpart, the counterpart is in contact with the crown and the counterpart and the crown are located along the longitudinal axis of the shaft.

The moveable element fixation mechanism is controlled by the movement of the crown or the counterpart in the direction or against the direction of the shaft axis.

The manipulation stage can be rotated around the shaft axis in positive and negative direction.

The advantage of this holder is that the change in stage tilt angle, which is an angle that is formed by the manipulation stage plane and the plane perpendicular to the electron beam axis, can be made simultaneously with the sample machining. Therefore, it is possible to significantly speed up the sample preparation that requires change of the holder position.

It is preferred to use the adjustable holder for preparation of TEM lamellas, e.g. using the front side method, the back side method, or for the production of a planar lamella, or potentially other methods, and for subsequent or continuous quality checks of this lamella with the use of scanning transmission electron microscopy (STEM). During these procedures it is necessary to change the holder tilt angle, and during some other procedures, even the stage tilt angle.

The advantage of the method is that in case where, during lamella preparation, it is necessary to change the sample orientation, e.g. during lamella preparation from the back side, no rotational needle of the micro-manipulator for the change of the sample orientation is needed, as in other similar methods. The sample orientation change in relation to the ion beam can be performed exclusively by changing the holder tilt angle of the adjustable holder.

Lamella preparation method with the use of an adjustable holder located inside the working chamber on the manipulation stage, the device comprising a beam for sample machining, e.g. a focused ion beam, and a beam for sample observation, e.g. an electron beam, and always includes the following steps:

setting the first stage tilt angle, and setting the first holder tilt angle;

sample preparation for lamella production from the substrate located in the sample holder with the use of an ion beam;

transferring the sample from the substrate into an adjustable sample holder;

machining of the sample located in the adjustable holder with the use of an ion beam;

changing the holder tilt angle into the second holder tilt angle;

quality check of the lamella with the use of an electron beam.

In a preferred embodiment of performing lamella preparation, the substrate is first placed in a non-adjustable holder, which is located on the manipulation stage with the first stage tilt angle. Using an ion beam and a micro-manipulator, a sample for lamella preparation is extracted from the substrate, which is placed into an adjustable holder set to a first holder tilt angle. The transfer of the sample is made without changing the sample orientation. The sample does not change its position in relation to the working chamber. The sample transfer can then be performed by such micro-manipulator that allows movement at least around one axis perpendicular to the substrate surface.

In another step, sample machining using an ion beam is performed and the adjustable holder is set to a second holder tilt angle, which is different from the first holder tilt angle.

In order to reach the required lamella position in relation to particle beams, the manipulation stage may or may not be tilted in a second stage tilt angle.

In practice, machining commonly uses such sample orientation where the ion beam axis is approximately parallel to the machining surface.

In another step, the quality check of the prepared lamella is performed by a particle beam, usually an electron beam. If TEM lamella quality is insufficient, i.e. in case, for example, it fails to have the required thickness or flatness, the adjustable holder and the manipulation stage return to the position, in which the sample was machined and the whole cycle repeats until the required TEM lamella properties are reached.

The holder tilt angle size and the stage tilt angle size can vary from 0 to 360 degrees. Regarding the limited space inside the working chambers, the stage tilt angle size of 90 degrees in positive and 90-degree angle in the negative rotation direction is the common maximum size.

The best results during the observation using transmission scanning technique in SEM are achieved when the SEM beam axis is approximately perpendicular to the lamella surface.

When machining using a particle beam, the most preferred position is the one in which the machining particle beam axis is parallel to the machined sample surface, or possibly corrected by the sample tapering angle.

In yet another preferred embodiment of the lamella preparation method, the substrate is located in a non-adjustable sample holder, which is located on the manipulation stage tilted by a first stage tilt angle. From the substrate, a sample is prepared with the use of a particle beam and extracted with the use of a micro-manipulator, which is placed into an adjustable holder tilted in the first holder tilt angle.

In another step, the adjustable holder is set to a second holder tilt angle, different from the first holder tilt angle, and the sample is machined by an ion beam.

In another step, the adjustable holder can be set to a third holder tilt angle, which is different from the second holder tilt angle.

The manipulation stage can be tilted in a second stage tilt angle, different from the first stage tilt angle.

In another step, the quality check of the prepared lamella is performed by an electron beam. If TEM lamella quality is insufficient, i.e. in case, for example, it fails to have the required thickness or flatness, the adjustable holder and the manipulation stage position return to the position in which the sample was machined and the whole cycle repeats until the required TEM lamella properties are reached.

DESCRIPTION OF DRAWINGS

The summary of the invention is further illustrated by means of exemplary embodiments, which are described with the use of the attached drawings, in which.

EXAMPLES OF INVENTION EMBODIMENTS

Figure 1:
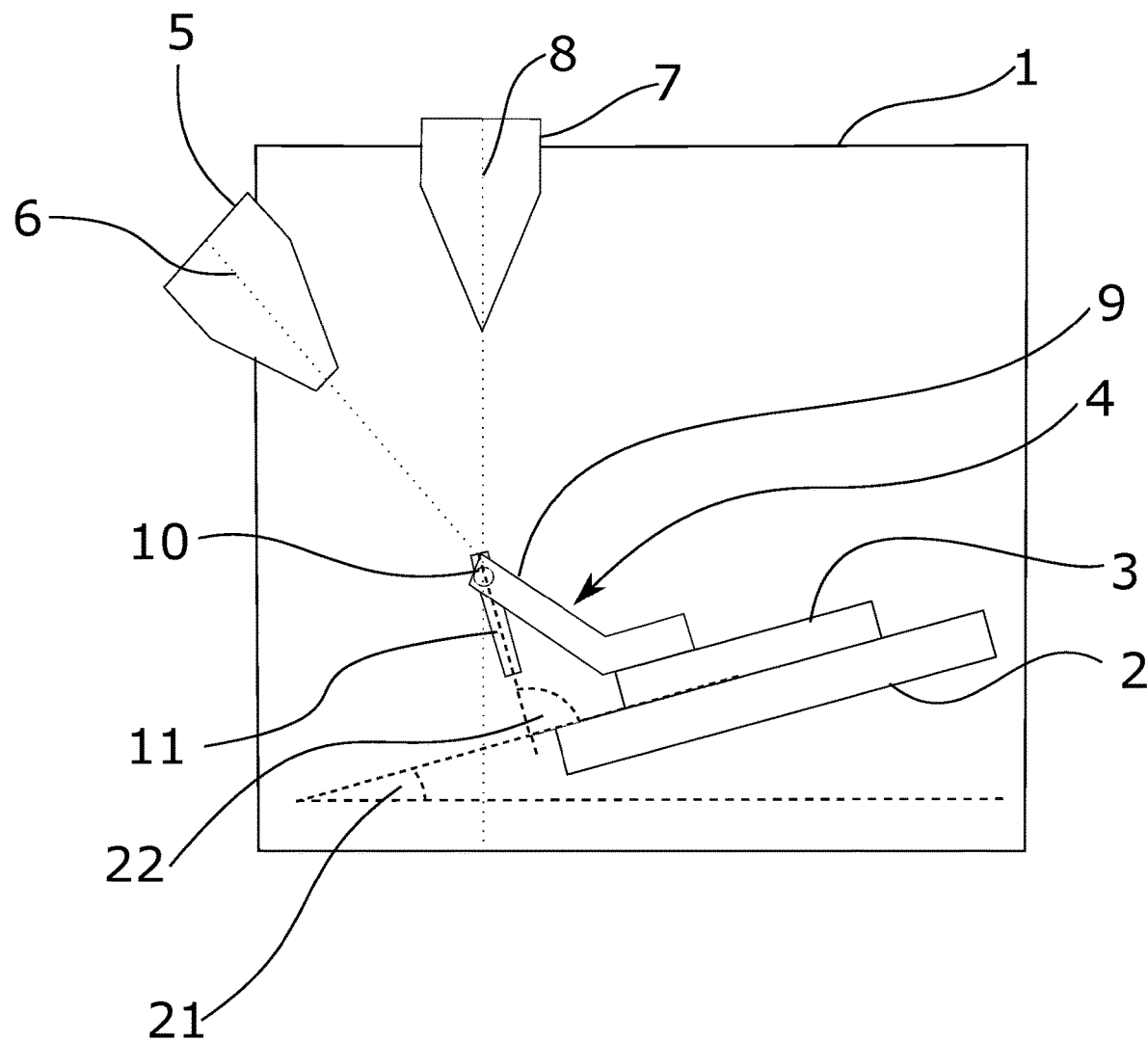
FIG. 1—displays a side view of an adjustable holder.

FIG. 1 shows a schematic side view of an adjustable holder 4. The device comprises a working chamber 1, inside of which a manipulation stage 2 provided with a placement area 3 is arranged, and further an adjustable holder 4, an ion column 5 having the axis 6 of the ion beam, along which an ion beam is distributed towards the sample 20 (not displayed) and an electron beam 7 having the axis 8 of the electron beam, along which an electron beam is distributed towards the sample 20.

The manipulation stage 2, which is provided with a moveable and rotating mechanism allowing movement along three independent mutually perpendicular axes, of which at least one is located in a plane parallel to the plane of the placement area 3, and rotation around three independent mutually perpendicular axes, of which at least one is located in a plane parallel to the plane of the placement area 3.

Ion beam 5 axis and electron beam 7 axis intersect approximately in the point of impact of beams onto the sample 20. Adjustable holder 4 comprises a support pillar 9 to support a shaft 10, on which a moveable element 11 is mounted. The shaft 10 is mounted in the pillar 9 in such way that it may rotate around its longitudinal axis. The moveable element 11 is firmly mounted to the shaft 10 and can be rotated using the shaft 10. The place of the moveable element 11 forms an angle 22 of holder tilt with the manipulation stage 2 plane. The manipulation stage 2 plane forms an angle 21 of stage tilt with a plane perpendicular to axis 8 of the electron beam.

In case of the holder tilt angle 22, an angle having a size of 0° is defined as an angle, in which the place 15 for sample 20 placement leads towards the manipulation stage 2 and the adjustable holder 4 plane is parallel to the manipulation stage plane. An angle having a size of 180° is defined as the angle, in which the place 15 for sample placement leads from the manipulation stage 2.

Figure 2A:
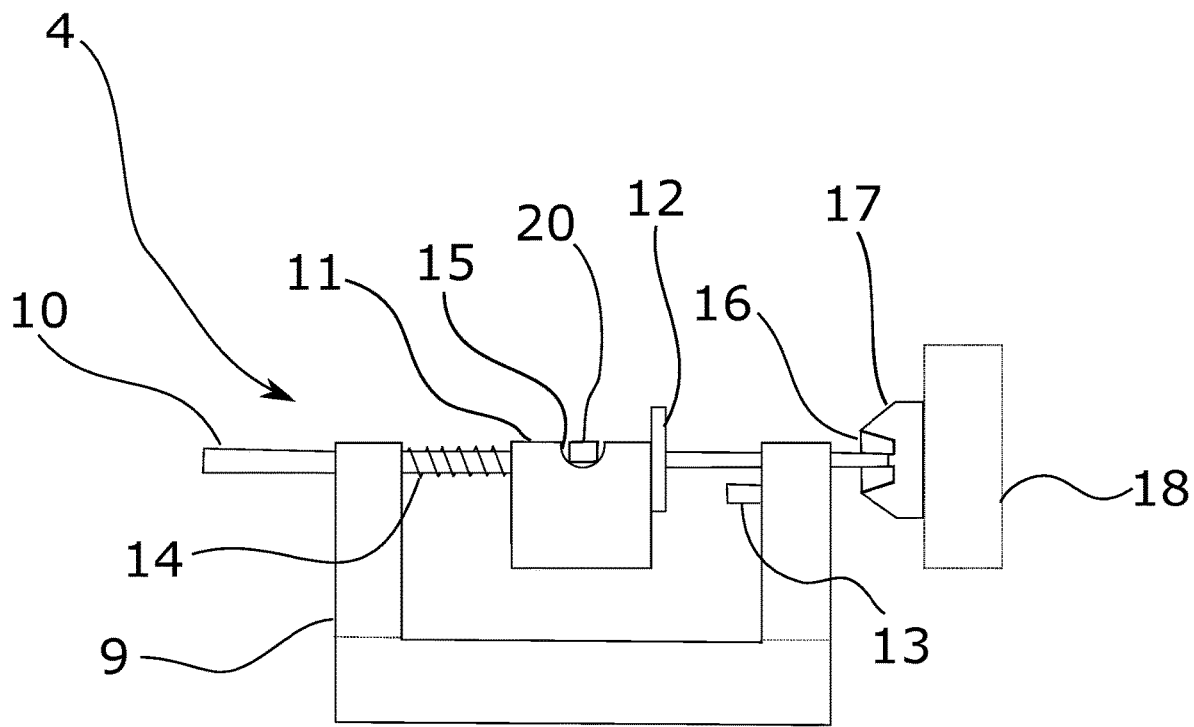
FIG. 2a, 2b, 2c—displays a front view of an adjustable holder.
Figure 2B:
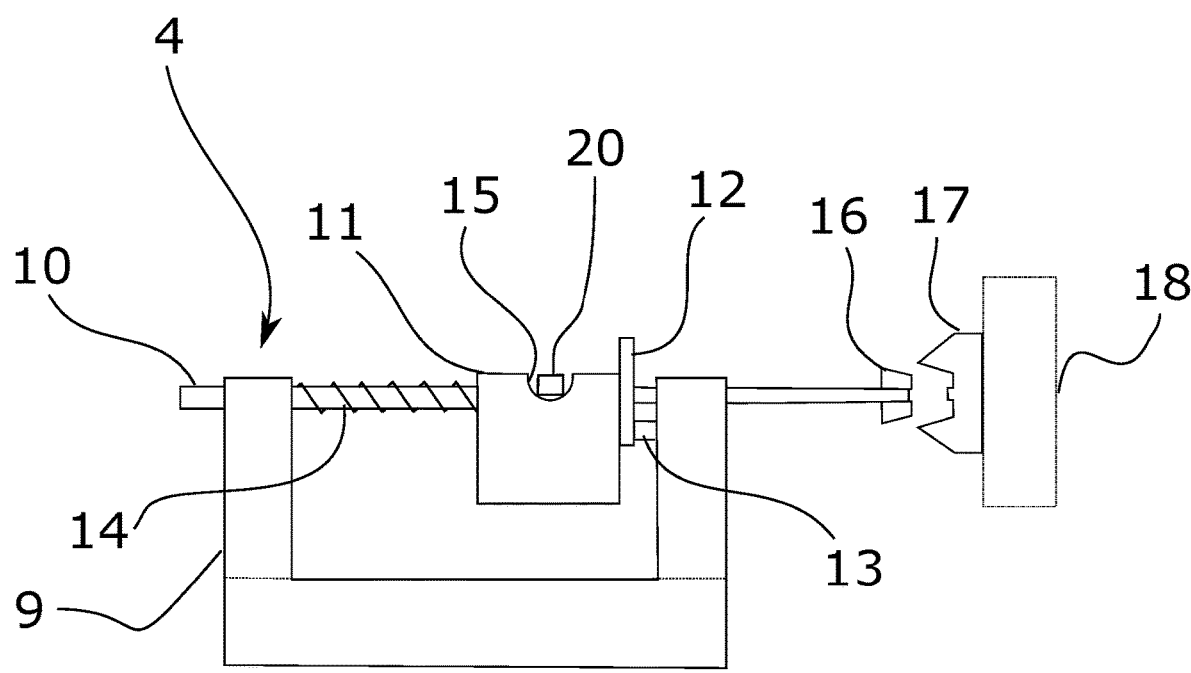
Figure 2C:
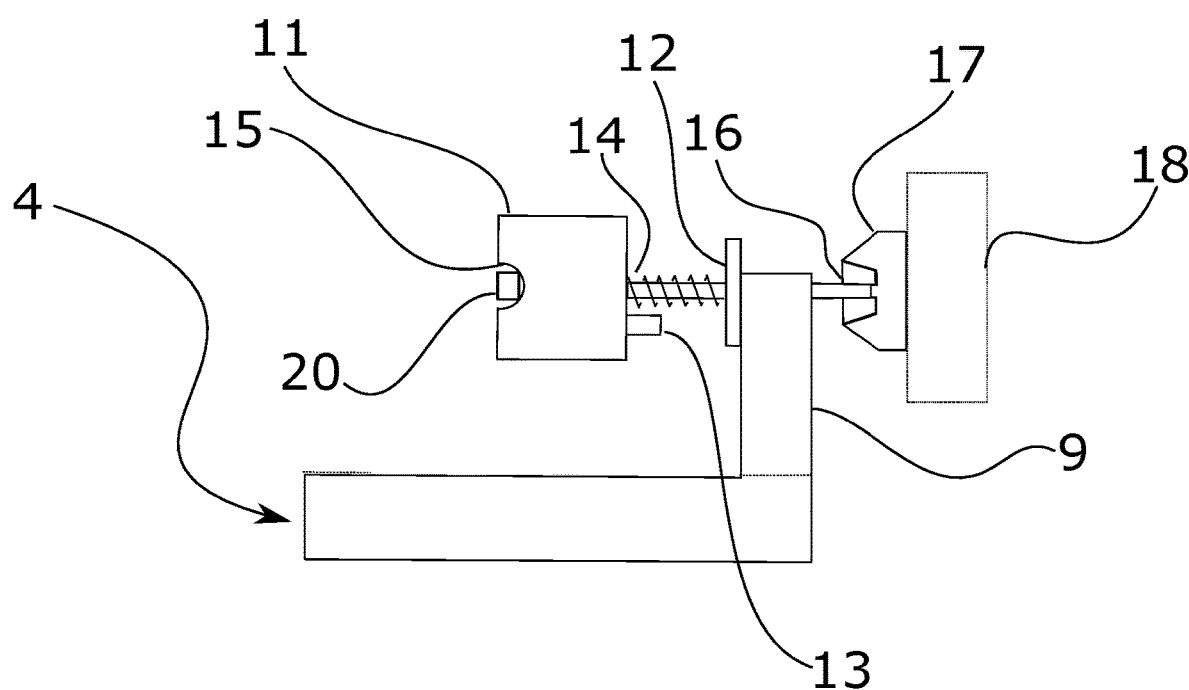

FIGS. 2a, 2b and 2c schematically show the adjustable holder 4 from the front view. Apart from parts of the adjustable holder 4 already displayed in FIG. 1, the adjustable holder 4 comprises a fixation mechanism comprising a rosette 12 mounted on the shaft 10, a pivot 13 mounted on a pillar 9 and a spring 14 and further a moveable element 11 with a place 15 for sample 20 placement and a crown 16 for controlling the fixation mechanism. In addition, the device comprises a counterpart 17 located on the internal equipment 18 of the working chamber 1. In a preferred embodiment, the sample 20 is located in the shaft 10 axis.

FIG. 2a shows an adjustable holder 4 in a released position. In this position, the crown 16 is pressed against the counterpart 17, wherein it overcomes the spring 14 resistance and the pivot 13 is pushed out of the rosette 12. Consequently, the shaft 10 is not locked with the pillar 9. The shaft 10 with the moveable element 11 is firmly connected to the counterpart 17 in this position and at the same time it can change position in relation to the manipulation stage 2. The counterpart 17 is mounted to the internal equipment of the working chamber 18, e.g. on the signal electron detector. However, it may be located on any equipment, which is arranged in at least one of the possible positions reachable by the crown 16 of the adjustable holder 4.

FIG. 2b shows the holder 4 in a non-adjustable position. The spring 14 presses the rosette 12 towards the support pillar 9, wherein the pivot 13 is located. The pivot 13 falls into the openings 19 in the rosette 12 thus locking the shaft 10 against the pillar 9 and the moveable element 11 cannot change its position in relation to the manipulation stage 2.

FIG. 2c shows another variant of the adjustable holder 4 with one pillar 9 in a released position. The difference from FIG. 2a is that the adjustable holder 4 has only one pillar 9 thus easier access to the moveable element 11 is possible from a side as well. The rosette 12 is, in this case, mounted to the pillar 9 and the corresponding pivot 13 is located on the moveable element 11. When in moveable position, the spring 14 is stretched, in contrast to adjustable holder in FIG. 2a, in which it is pressed. After releasing the crown 16 the rosette 12 is drawn to the pillar 9, the pivot 13 is pushed into the rosette 12 and, consequently, the moveable element 11 is locked.

Figure 3:
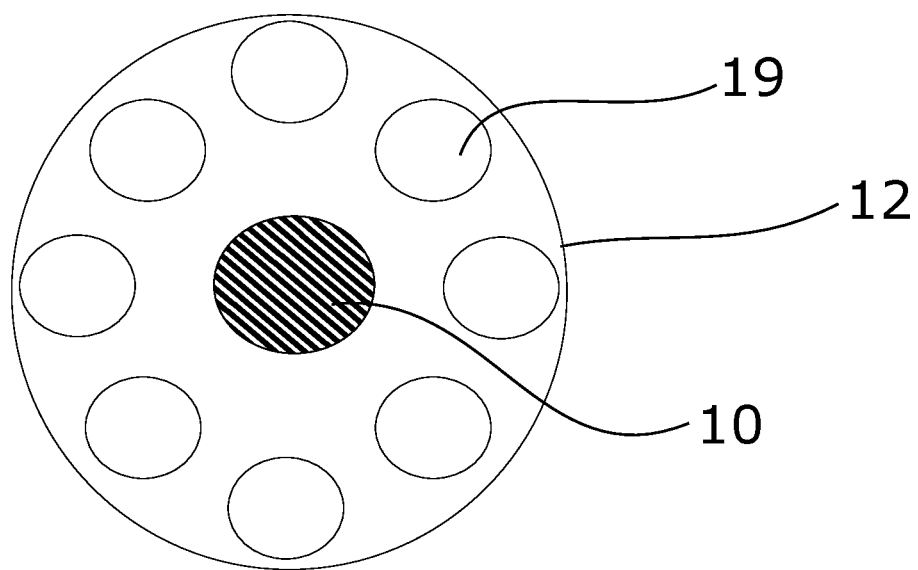
FIG. 3—displays one of the potential examples of a rosette.

FIG. 3 shows a side view of one of potential rosette 12 shapes. The rosette 12 comprises, along its circumference, round openings 19 for pivots 13 fitting the pivot 13 shape. Along the circumference, the openings 19 are arranged in angle spacing of the size γ, which equals 45 degrees. The center of the rosette 12 is intersected by the shaft 10. The openings 19 on the rosette 12 as well as the pivot 13 may be of various sizes and shapes, although they should always ensure that after locking, the movements of the rosette 12 in relation to the pivot 13 are not possible. In a preferred embodiment, the openings in the rosette 12 and the pivot 13 shape should fit in terms of shape and size.

Figure 4:
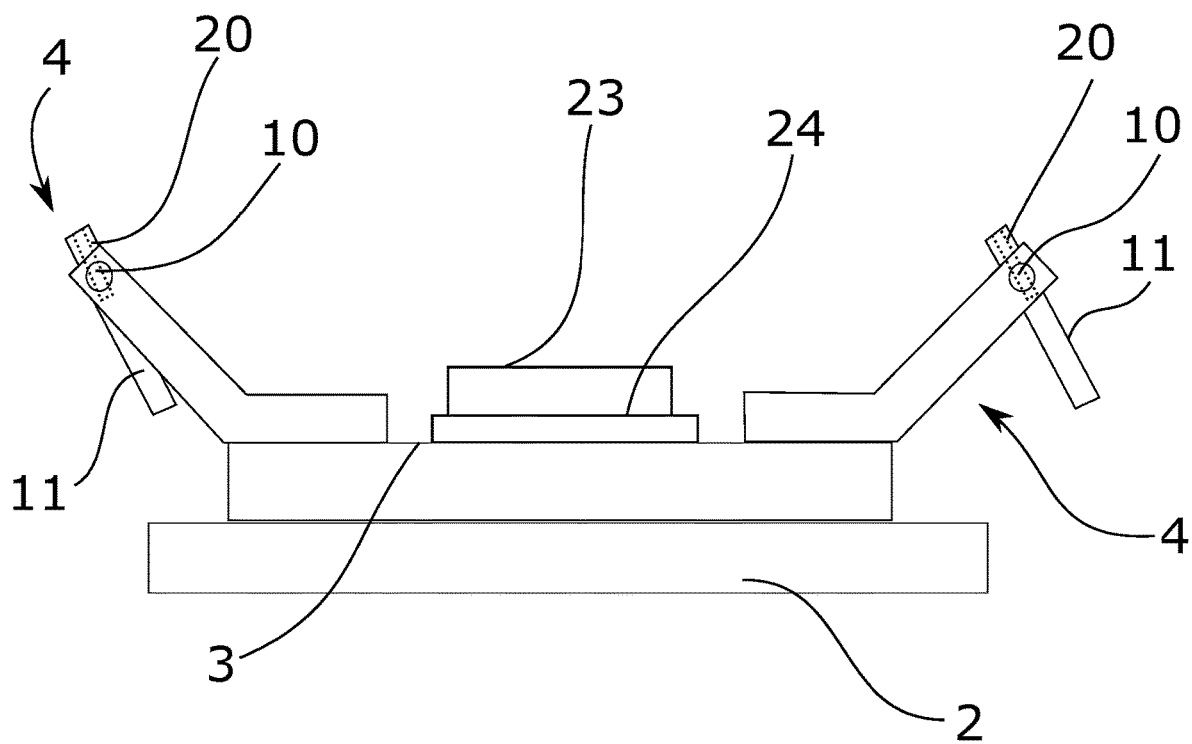
FIG. 4—displays one of the examples of potential arrangement of holders on the manipulation stage.

FIG. 4 shows a manipulation stage 2, on which two samples 20 are located in adjustable holders 4 and the substrate 23 in a non-adjustable holder 24.

Figure 5A:
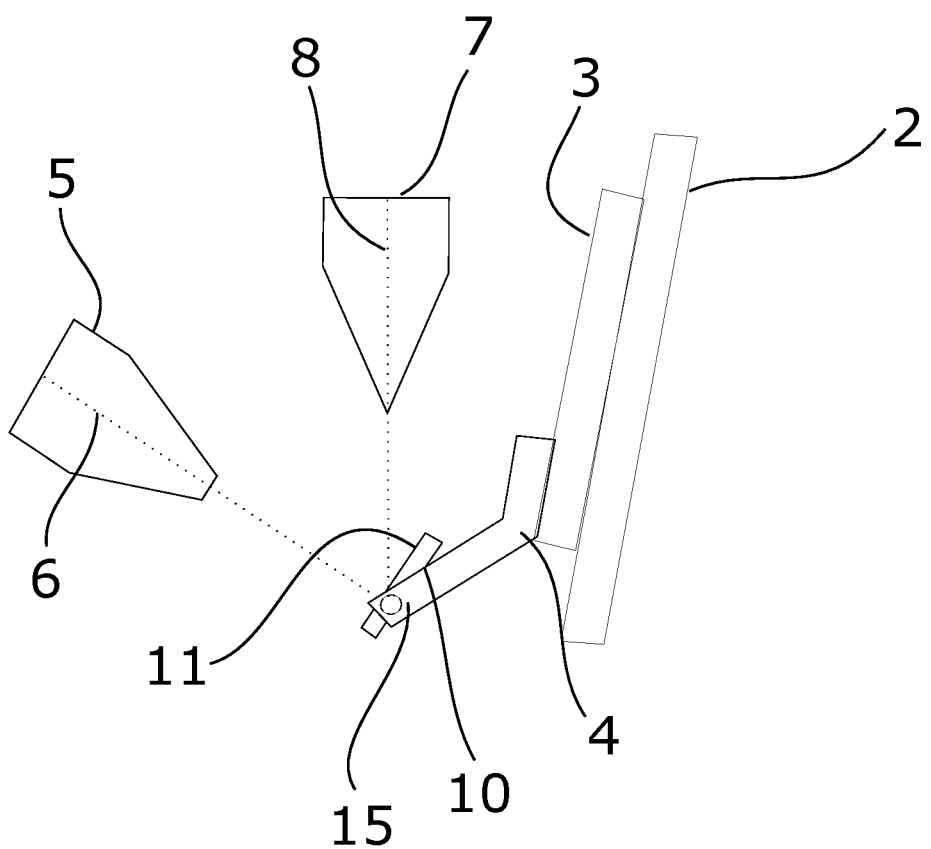
FIG. 5a, 5b, 5c—displays a schematic process of changing the position of a moveable element.
Figure 5B:
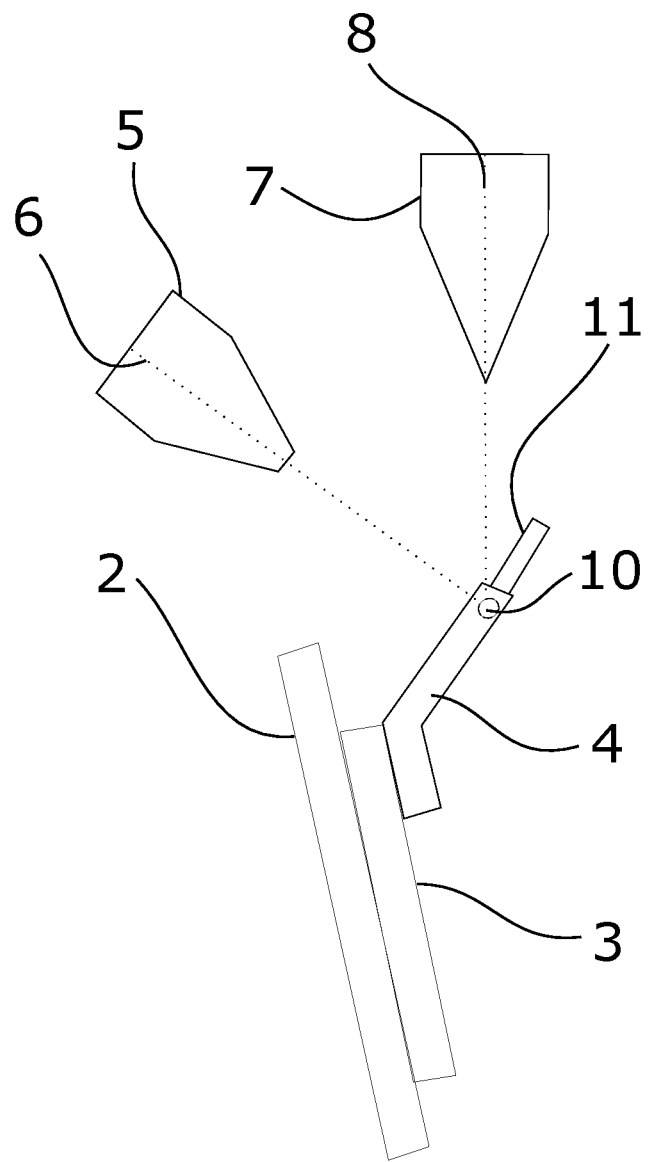
Figure 5C:
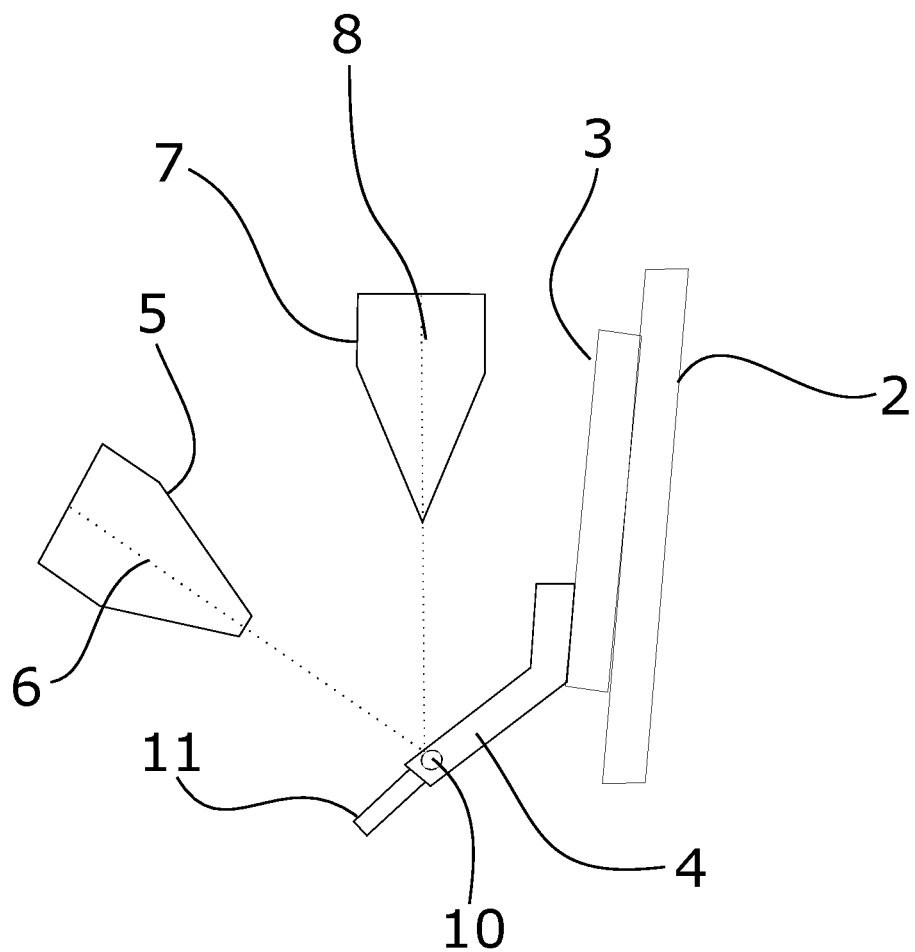

FIGS. 5a, 5b and 5c display a schematic position change process of a moveable element 11 of an adjustable holder 4.

FIG. 5a shows an adjustable holder 4 in relation to the ion beam axis 6 and the electron beam axis 8 in the first position. The ion beam axis 6 with the electron beam axis 8 form an angle of approximately 55 degrees and the electron beam axis 8 with the placement area 3 form and angle lower than 10 degrees, and with the ion beam axis 6 an angle ranging from 55° to 65°. FIB beam falls onto the moveable element plane approximately at the angle of 90 degrees and the sample 20 is irradiated from the first side.

The moveable element 11 is put into a moveable position where it is not possible to change the moveable element 11 position in relation to the ion beam axis 6 and the electron beam axis 8 and it is possible to change position of the moveable element 11 in relation to the manipulation stage 2.

FIG. 5b shows an adjustable holder 4 in a second position that differs from the first position only in that, in comparison to the situation in FIG. 5a, the position of the moveable element 11 rotated by more than 140 degrees around the shaft 10 axis. The position of the moveable element 11 in relation to the electron beam axis 8 remains unchanged.

The moveable element 11 is put into a non-moveable position, in which it is not possible to change the moveable element 11 position in relation to the manipulation stage 2, but it is possible to change the position of the moveable element 11 in relation to the ion beam axis 6 and the electron beam axis 8.

FIG. 5c shows an adjustable holder 4 in a third position, in which the adjustable holder 4 is put into approximately the same position as in FIG. 5a, where the angle between the electron beam axis 8 and the placement area 3 is lower than 10 degrees. FIB beam is impinging on the moveable element 11 plane approximately at the angle of 90 degrees and the sample 20 is irradiated from the other side. The difference between the position in FIG. 5a and FIG. 5c is based on the fact that the moveable element 11 is rotated by more than 140° in comparison with the FIG. 5a.

If the adjustable device of the manipulation stage 2 does not allow sufficient tilt to perform the whole operation in a single step, it is possible to repeat the individual steps until the required position is reached.

If the sample 20 is not located in the shaft 10 axis, other slight corrections are usually necessary, by movements or rotation of the manipulation stage 2.

Figure 6:
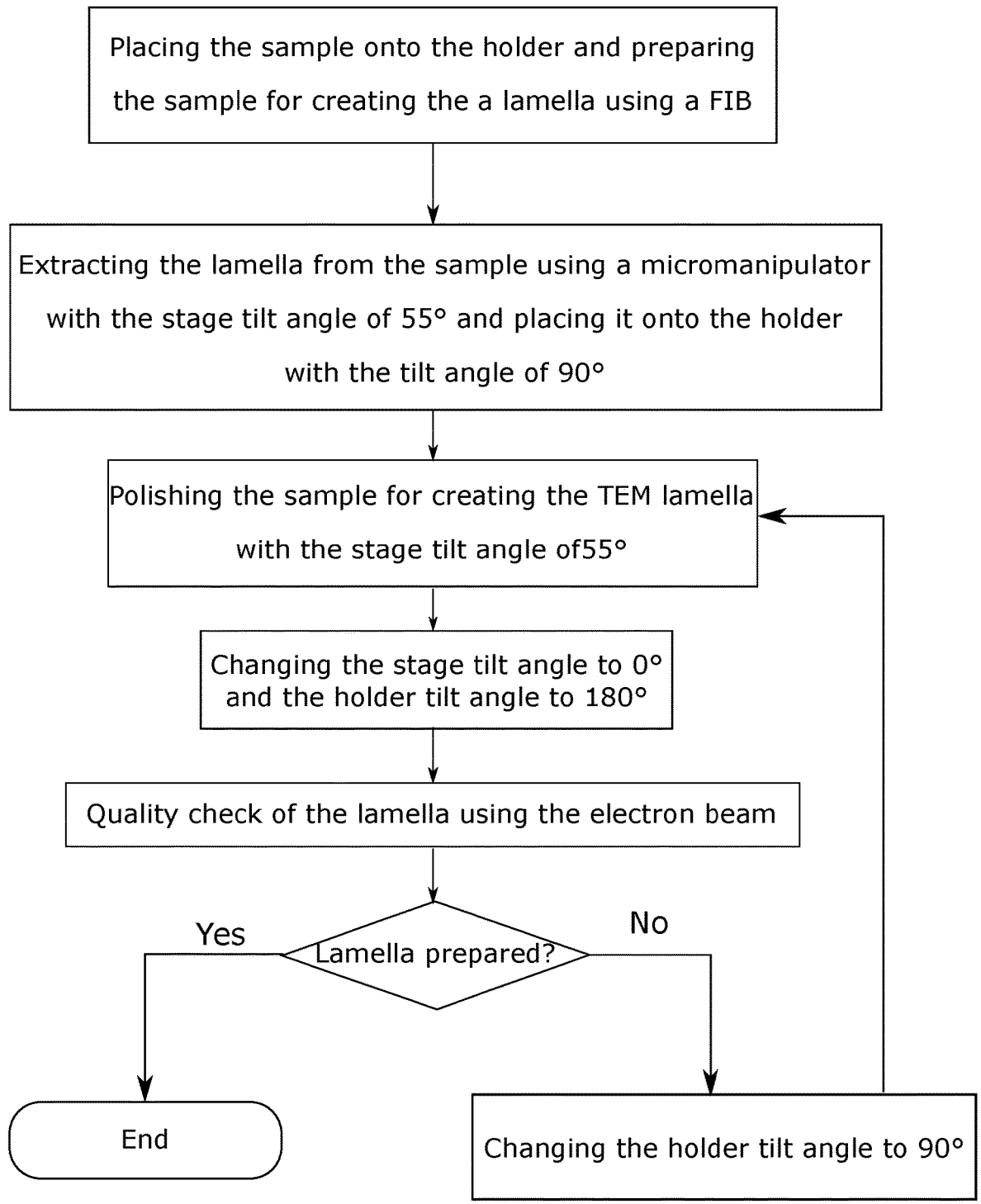
FIG. 6—displays lamella preparation procedure from the front.

FIG. 6 shows the first TEM lamella preparation method from the front. In the first step, the substrate 23 is placed on the placement area 3, the area 3 being parallel to manipulation stage 2 plane. From this substrate 23 a sample 20 is prepared with the use of FIB for the production of a TEM lamella. The sample 20 is extracted from the substrate 23 at the tilt under the angle 21 of stage tilt of 55° with the use a manipulation device, e.g. a micro-manipulator. The adjustable holder 4 is tilted by the angle 22 of holder tilt of 90°. The sample 20 is mounted to an adjustable holder 4. In another step, with the use of FIB beam, the sample 20 is polished and formed into a TEM lamella. The ion beam axis 6 intersects the sample 20 approximately in parallel with the lamella machined surface. After machining, the angle 22 of holder tilt is set to 180° and the angle 21 of stage tilt is set to 0° and the prepared lamella quality is checked. The check may be performed with STEM and includes lamella thickness and flatness check. If the lamella meets the required parameters, the method is completed. If the required parameters are not met, the angle 22 of holder tilt is changed to 90° and the angle 21 of stage tilt to 55° and polishing is performed repeatedly.

Figure 7:
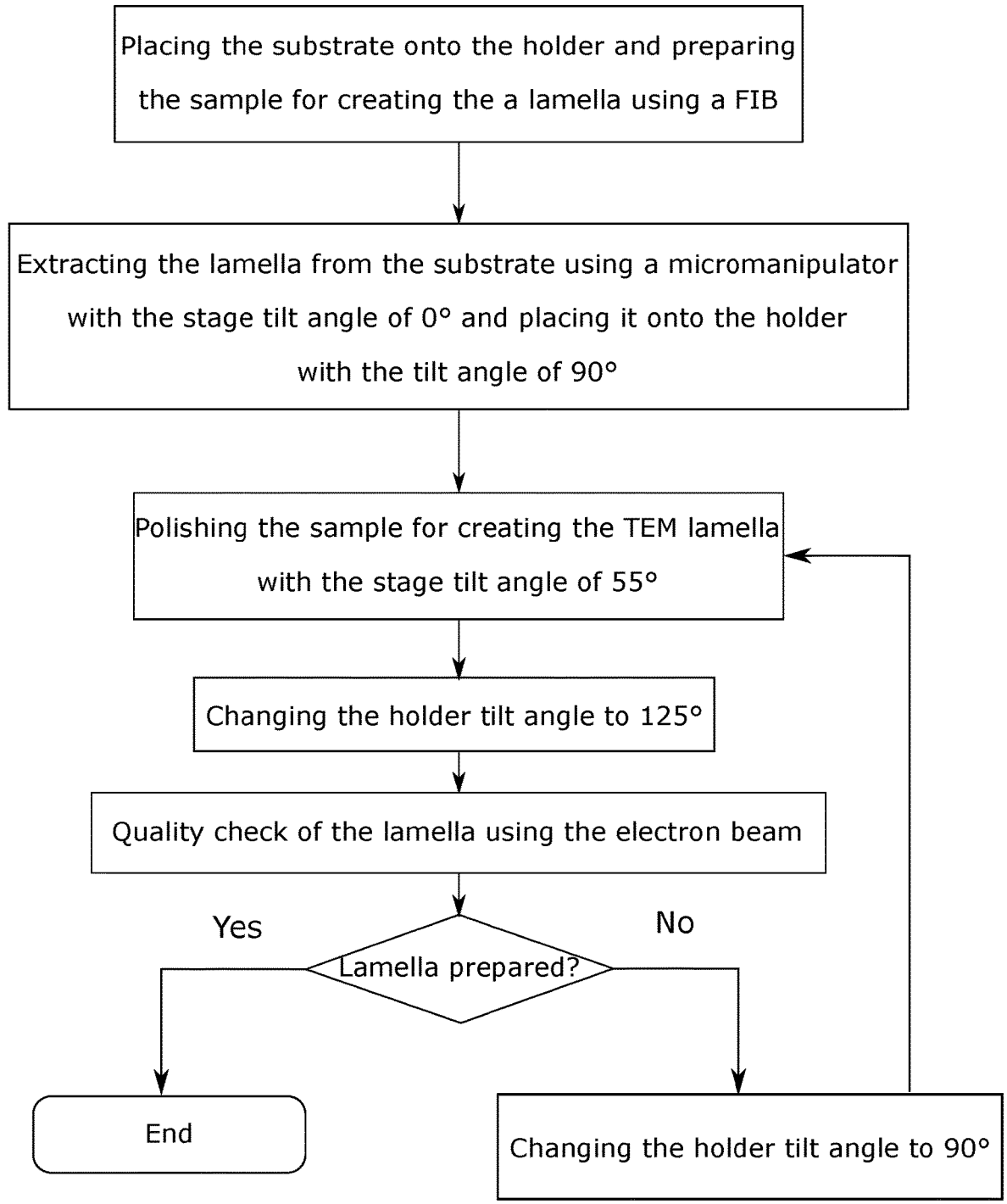
FIG. 7—displays further lamella preparation procedure from the front.

FIG. 7 shows another lamella preparation method from the front. In contrast to FIG. 6, the sample 20 for the lamella preparation is extracted at the angle 21 of stage tilt of 0° and is placed into an adjustable holder 4 with the angle 22 of holder tilt of 90°. Afterwards, the angle 22 of stage tilt is changed to 55°, when the sample 20 is polished using the FIB. Subsequently, the angle 22 of holder tilt is changed to 125°. The subsequent check may be performed with STEM and includes lamella thickness and flatness check. If the lamella meets the required parameters, the method is completed. If the required parameters are not met, the angle 22 of holder tilt is changed to 90° and the angle 21 of stage tilt to 55° and polishing is performed repeatedly.

Figure 8:
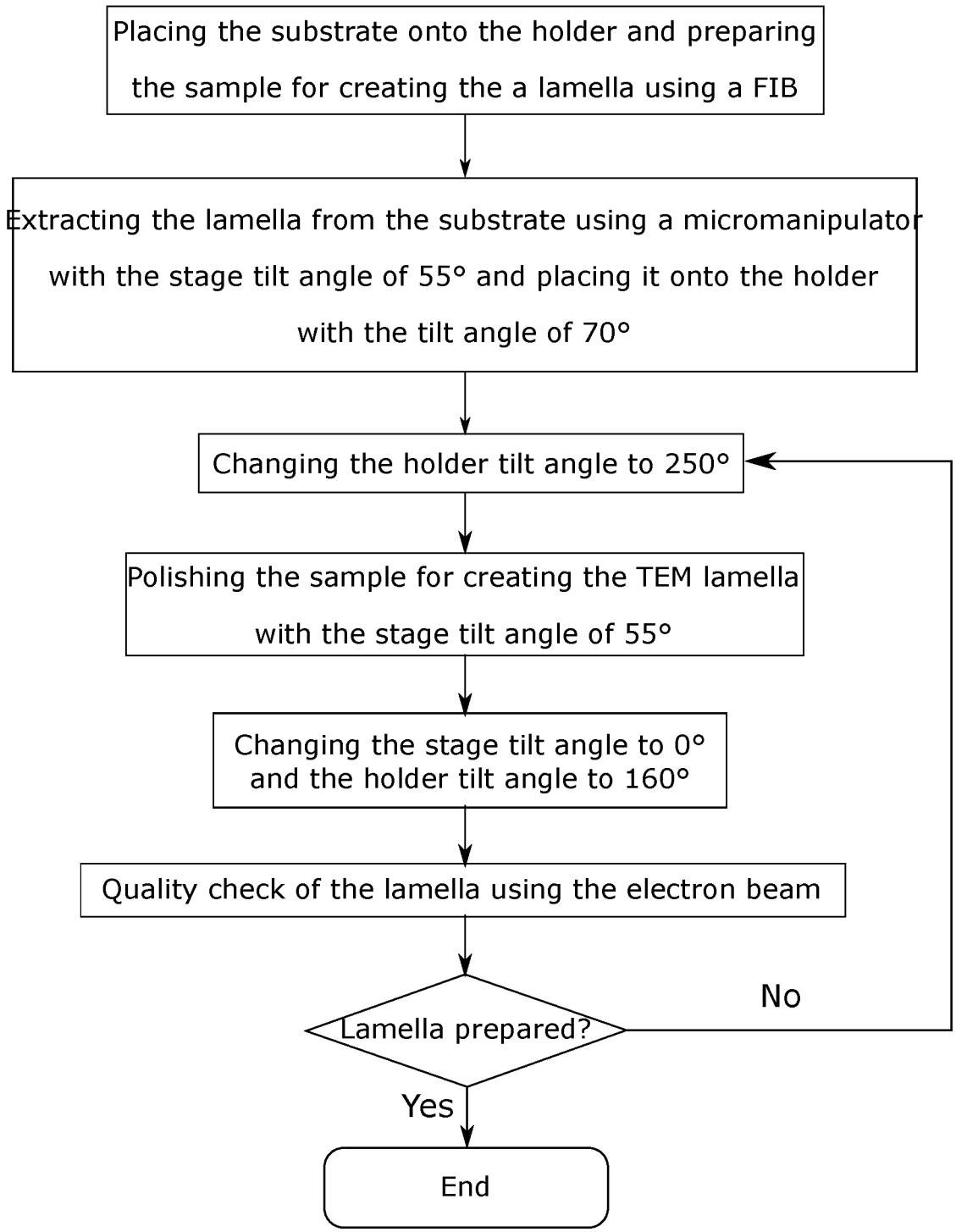
FIG. 8—displays lamella preparation procedure from the back side.

FIG. 8 shows lamella preparation method from the back side. In the first step, the substrate 23 is placed on a placement area 3, the area 3 being parallel to the manipulation stage 2 plane. From this substrate 23 a sample 20 is prepared using the FIB for the production of a TEM lamella. The sample 20 is extracted from the substrate 23 at the tilt under the angle 21 of stage tilt of 55° using a manipulation device, e.g. a micro-manipulator. The adjustable holder 4 is tilted by the angle of 22 of holder tilt of 70°. After placing the sample into the adjustable holder 4, the angle 22 of holder tilt is changed to 250°. Afterwards, lamella polishing is made at the angle 21 of stage tilt of 55°. After polishing, the angle 21 of stage tilt is set to 0° and the angle 22 of holder tilt to 160° and the lamella quality is checked. The check may be performed with STEM and includes lamella thickness and flatness check. If the lamella meets the required parameters, the method is completed. If the required parameters are not met, the angle 22 of holder tilt is changed to 250° and the angle 21 of stage tilt to 55° and polishing is performed repeatedly.

Figure 9:
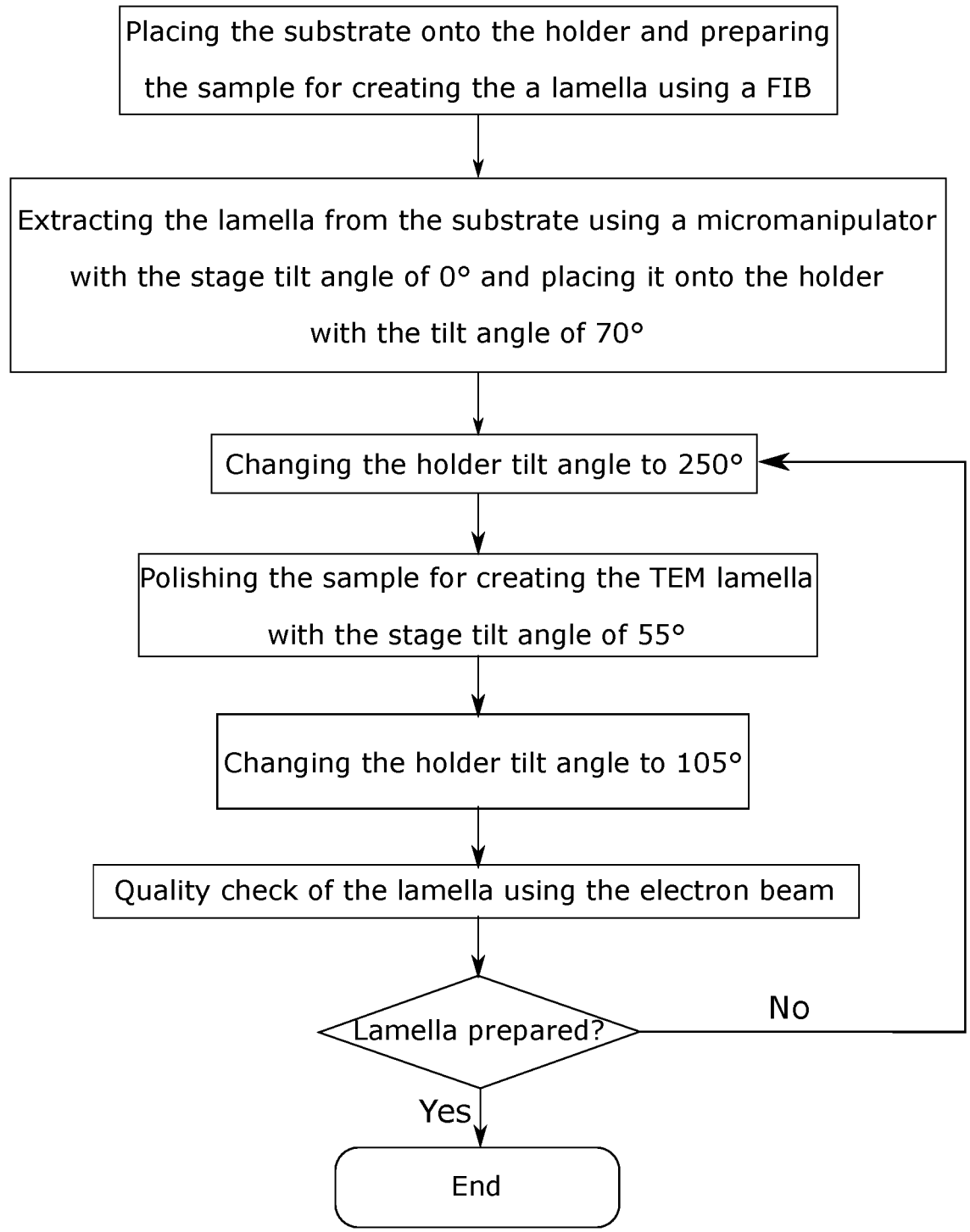
FIG. 9—displays further lamella preparation procedure from the back side.

FIG. 9 shows another embodiment of lamella preparation from the back side. The difference from the method shown in FIG. 8 is that the sample 20 extraction for lamella production is made at the angle 21 of stage tilt of 0° and lamella quality check at the angle 22 of holder tilt of 105° and the angle 21 of stage tilt of 55°.

Figure 10:
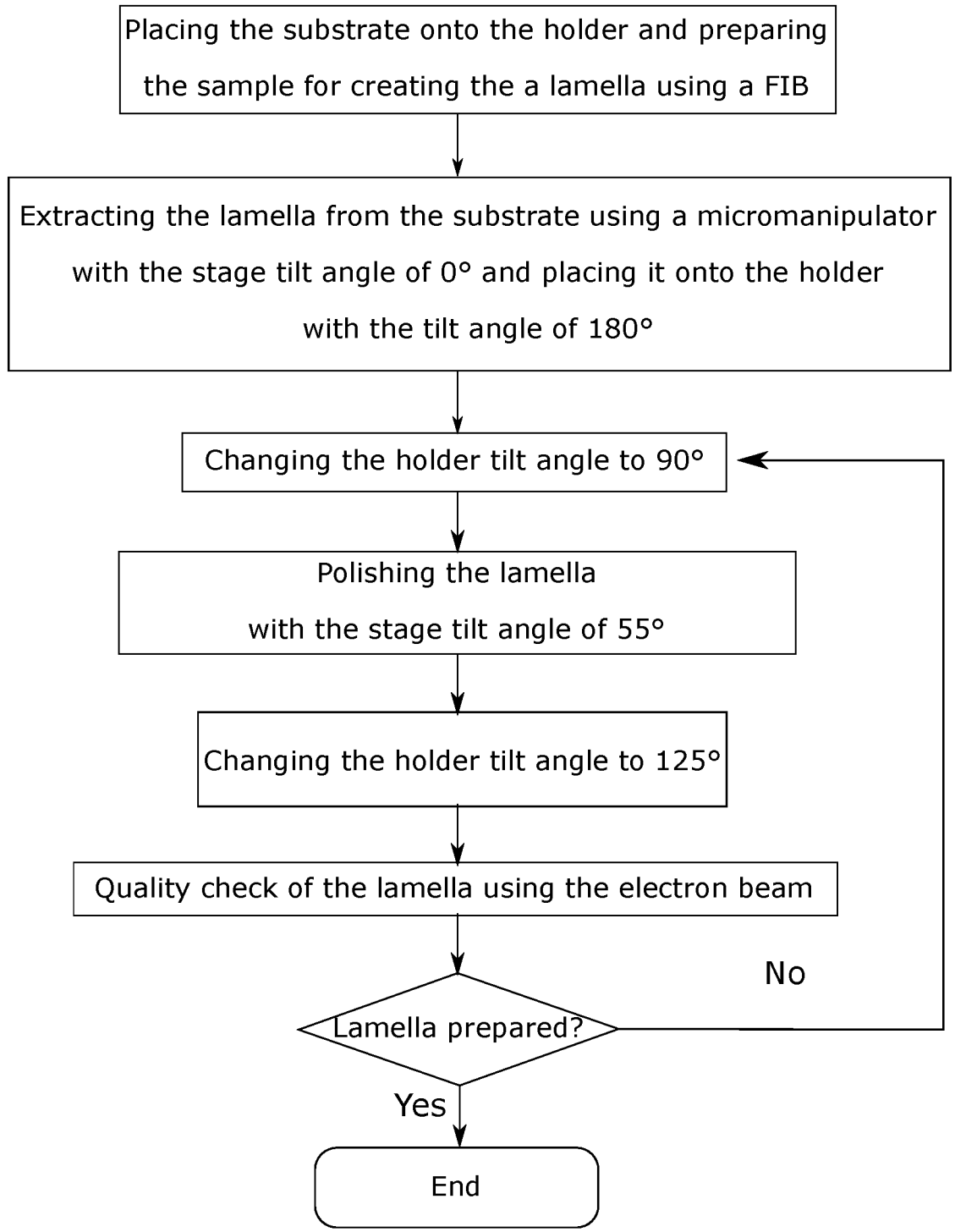
FIG. 10—displays planar lamella preparation procedure.

FIG. 10 shows planar lamella preparation method. In the first step, the substrate 23 is placed on the placement area 3, the area 3 being parallel to the manipulation stage 2 plane. From this substrate 23 a sample 20 is prepared using the FIB for the production of a TEM lamella. The sample 20 is extracted from the substrate 23 at the tilt under the angle 21 of stage tilt of 0° using a manipulation device, e.g. a micro-manipulator. The adjustable holder 4 is tilted by the angle of 22 of holder tilt of 180°. After placing the sample into the adjustable holder 4, the angle 22 of holder tilt is changed to 90°. Afterwards, lamella polishing is made at the angle 21 of stage tilt of 55°. After polishing, the angle 22 of holder tilt is set to 135° and the lamella quality is checked. If the lamella meets the required parameters, the method is completed. If the required parameters are not met, the angle 22 of holder tilt is changed to 90° and the angle 21 of stage tilt to 55° and polishing is performed repeatedly.

The above mentioned are just selected examples of how an adjustable holder can be used for sample preparation. A person skilled in the art would find other ways to prepare or observe a sample using the adjustable holder.

LIST OR REFERENCE NUMBERS

1) Working chamber
2) Manipulation stage
3) Placement area
4) Adjustable holder
5) Ion column
6) Ion beam axis
7) Electron column
8) Electron beam axis
9) Pillar
10) Shaft
11) Moveable element
12) Rosette
13) Pivot
14) Spring
15) Place for sample
16) Crown
17) Counterpart
18) Internal chamber equipment
19) Opening for pivot
20) Sample
21) Stage tilt angle
22) Stage holder angle
23) Substrate
24) Non-adjustable holder

The invention claimed is:

1. A device with at least one adjustable sample holder comprising an adjustable sample holder located inside a working chamber on a placement area of a manipulation stage, wherein the adjustable sample holder comprises a moveable element with a place for sample placement, a revolving shaft having a longitudinal axis, at least one pillar adapted to support the shaft, the device further comprising a mechanism for fixing the moveable element comprising a crown mounted on the shaft and a counterpart adapted to immobilize the shaft in relation to the counterpart, the mechanism for fixing further being adapted to set the moveable element into a stationary position, in which a movement range of the manipulation stage is retained, and a moveable position, in which the adjustable sample holder has at least one degree of freedom, wherein in the moveable position of the moveable element is adapted for rotation around a longitudinal axis of the shaft, allowing changing of the position of the placement area in relation to the moveable element.

2. The device according to claim 1 wherein the mechanism for fixing the moveable element comprises a pivot on the at least one pillar, a rosette provided with openings for placing the pivot, wherein the openings correspond in size to the pivot and are arranged along a circumference of the rosette, and a pressure device adapted to accommodate the pivot in the opening for the pivot inside the working chamber.

3. The device according to claim 1 wherein a movement vector allowing changing of the position of a moveable element plane in relation to a placement area plane in the moveable position of the moveable element lies in a plane perpendicular to an axis parallel to the shaft axis.

4. The device according to claim 3 wherein the movement allowing changing of the position of the moveable element plane in relation to the placement area plane in the moveable position of the moveable element includes rotation about an axis that aligns with the shaft axis.

5. The device according to claim 1 wherein when changing the position of the moveable element in relation to the placement area, the moveable element is in stationary position in relation to the working chamber.

6. The device according to claim 1 wherein it has two pillars.

7. The device according to claim 1 wherein the sample in the adjustable holder is located in the shaft axis.

8. The device according to claim 1 further comprising at least one non-adjustable holder, which has no degree of freedom, can be put onto the manipulation stage.

9. The device according to claim 1 further comprising an electron column and an ion column.

10. A method of changing a tilt angle of the adjustable sample holder using the device according to claim 2, comprising the steps of:
   a) placing the adjustable sample holder having a first value of a holder tilt angle and the mechanism for fixing the moveable element in the stationary position into a position when the crown is near the counterpart;
   b) releasing the mechanism for fixing the moveable element by pressing the crown or the counterpart with a force sufficient to overcome a resistance of the crown or the counterpart;
   c) rotating the manipulation stage around the longitudinal axis of the shaft, so that a moveable element plane and a manipulation stage plane form a second value of the holder tilt angle, different from the first value of the holder tilt angle, so that during the change of tilt of the moveable element in relation to the placement area, the moveable element is in a stationary position in relation to the axis of an ion beam and the axis of an electron beam; and
   d) reinstating the mechanism for fixing the moveable element into the stationary position by moving the crown and the counterpart away from each other.

11. The method according to claim 10 wherein the step of rotating the manipulation stage around the longitudinal axis of the shaft, so that the moveable element plane and the manipulation stage plane form the second holder tilt angle, different from the first holder tilt angle, can be repeated multiple times during the method performance.

12. A method of preparing a lamella for transmission electron microscopy using the device with the adjustable sample holder according to claim 1, comprising the steps of:
   a) setting a first stage tilt angle;
   b) setting a first value of a holder tilt angle;
   c) preparing the sample for lamella production from the substrate located in a non-adjustable sample holder with the use of an ion beam;
   d) transferring the sample from the substrate into the adjustable sample holder;
   e) machining the sample located in the adjustable holder using the ion beam;
   f) changing the holder tilt angle into a second value of the holder tilt angle, so that during the change of the tilt of the moveable element in relation to the placement area, the moveable element is in a stationary position in relation to an axis of the ion beam and an axis of an electron beam; and
   g) checking the lamella quality using the electron beam.

13. The method according to claim 12, further comprising at least one change of the stage tilt angle into a second stage tilt angle corresponding to the second value of the holder tilt angle, and different from the first stage tilt angle.

14. The method according to claim 12 further comprising at least one more change of the holder tilt angle into a third value of the holder tilt angle corresponding to a third value of the holder tilt angle, different from the second value of the holder tilt angle.

15. The method according to claim 12 wherein the change of the stage tilt angle is made during sample machining using a focused ion beam.

16. The method according to claim 12 wherein the lamella quality check is performed using transmission scanning electron microscopy.

17. The method according to claim 12 wherein when transferring the sample from the non-adjustable holder into second adjustable holder, the orientation of the sample remains unchanged.

* * * * *